US005703956A

United States Patent [19]

Kim

[11] Patent Number: 5,703,956

[45] Date of Patent: Dec. 30, 1997

[54] EXTERNAL MEMORY CONTROL CIRCUIT FOR SOUND FIELD PROCESSING DIGITAL SIGNAL PROCESSOR

[75] Inventor: Jong Hyun Kim, Seoul, Rep. of Korea

[73] Assignee: LG Electronics Inc., Seoul, Rep. of Korea

[21] Appl. No.: 522,707

[22] Filed: Sep. 1, 1995

[30] Foreign Application Priority Data

Sep. 3, 1994 [KR] Rep. of Korea ........................ 94 22178

[51] Int. Cl.[6] ........................................ H03G 3/00

[52] U.S. Cl. .................................. 381/63; 381/61; 84/630

[58] Field of Search .................................. 381/63, 61, 62; 84/707, 630, 631, 708

[56] References Cited

U.S. PATENT DOCUMENTS 5,065,433 11/1991 Ida ............................................. 381/63

5,201,005 4/1993 Matsushita ................................ 381/63

*Primary Examiner*—Curtis Kuntz

*Assistant Examiner*—Minsun Oh

[57] ABSTRACT

An external memory control circuit for a sound field processing digital signal processor capable of obtaining continuous sound listening by shortening the time that sound is cut off upon a change of the sound field algorithm depending on the listening place (i.e., concert hall, meeting hall, church or the like). The external memory control circuit is constructed to utilize a mute function only for the time required to transfer the algorithm itself where a sound field processing circuit is realized using a DSP, thereby reducing the time that sound is cut off and thereby obtaining continuous sound listening even when the sound field algorithm is changed while listening.

8 Claims, 8 Drawing Sheets

FIG.8A
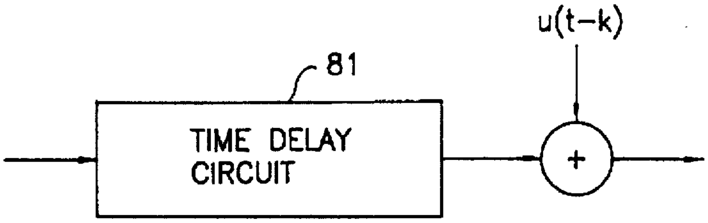
FIG.8B
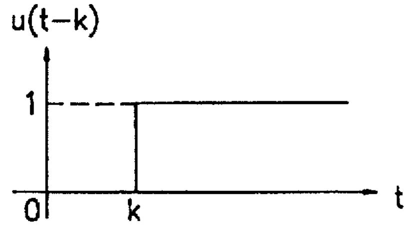
FIG. 9A
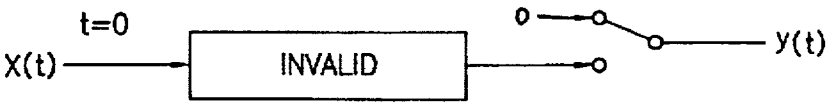
FIG. 9B
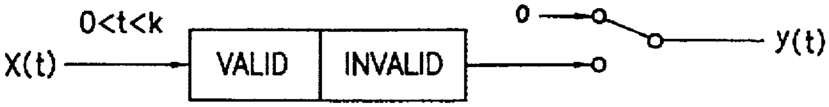
FIG. 9C
FIG. 9D
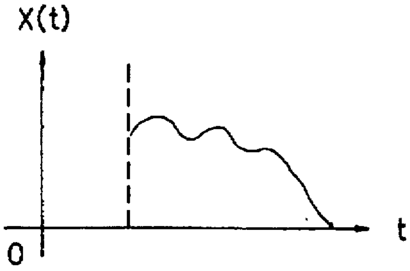
FIG. 9E

EXTERNAL MEMORY CONTROL CIRCUIT FOR SOUND FIELD PROCESSING DIGITAL SIGNAL PROCESSOR

BACKGROUND OF THE INVENTION

1. Field of the Invention

The present invention relates to the removal of residual sound in digital signal processors (DSP's) used in processing sound fields, and more particularly to an external memory control circuit for such DSP's capable of obtaining continuous sound listening by shortening the time that sound is cut off upon a change of the sound field algorithm depending on the listening place (i.e., concert hall, meeting hall, church or the like).

2. Description of the Prior Art

In a sound field such as concert hall, church or the like, sound generated from a sound source is classified into direct sound, which is directly transmitted to listeners, and echo sound, which is transmitted to listeners after being reflected at least once by walls or a ceiling. Since the direct sound and echo sound have a difference in path length, these two signals have a time interval. Furthermore, echo sound is classified into initial echo sound reaching listeners after being reflected in a relatively small number of times and later echo sound reaching listeners after being subjected to reflection, refraction and dispersion in a large number of times. When listeners listen to such echo sound, they have a particular spatial feeling. In order to make listeners feel like they are listening to sound in a desired sound field such as concert hall or church, a sound field processing circuit is provided which is adapted to artificially synthesize echo sounds such that the resulting sound is similar to the echo sound generated in the sound field.

FIG. 1 is a block diagram illustrating a general sound field processing circuit. As shown in FIG. 1, the sound field processing circuit includes an analog/digital (A/D) converter 4 for converting an analog signal 2 into a digital signal 3, a DSP for performing a computational operation to execute a sound field processing for the digital signal 3, and a digital/analog (D/A) converter 8 for converting a digital signal 6 output from the DSP 5 into an analog signal 7. A memory unit 12 is also provided which is controlled by an address signal 9, a memory control signal 10 and a data signal 11 all generated from the DSP 5 to achieve a signal delay required in the computational operation for the sound field processing. The sound field processing circuit also includes a control unit 13 for controlling the operation of the DSP 5.

FIG. 2 is a block diagram illustrating a detailed construction of the DSP 5 shown in FIG. 1. As shown in FIG. 2, the DSP 5 includes a host interface 27 connected to the control unit 13 and adapted to receive a command signal for, example, changing an algorithm, and a DSP control unit 21 adapted to apply, to a control signal bus 35, various command signals received from the control unit 13 via the host interface 27 and control signals for controlling various parts of the DSP 5 in accordance with algorithms stored in a program memory 24. The program memory 24, which constitutes a part of the DSP 5, is stored with various algorithm. The DSP 5 also includes a coefficient memory 25 adapted to store various coefficients required to execute the algorithms and apply them to an internal data bus 34 in accordance with control signals associated therewith if desired, a data memory 26 adapted to store temporary data required to execute the algorithms and apply them to the internal data bus 34 if desired, and a controlling peripheral equipment control unit 29 for peripheral equipment connected to the DSP 5. The DSP 5 further includes an operating unit 23 adapted to arithmetically and logically operate the data stored in the coefficient memory 25 and data memory 26 under a control of the DSP control unit 21 and apply the resulting values to the internal data bus 34, an external memory control unit 28 adapted to generate the address signal 9, memory control signal 10 and data signal 11 for controlling the memory device 12 connected to the DSP 5, a signal input unit 22 adapted to receive the digital signal 3 and apply it to the internal data bus 34, and a signal outputting unit 30 adapted to receive a value obtained after completing the execution of the algorithms and output it.

FIG. 3 is a block diagram illustrating a detailed construction of the external memory control unit 28 shown in FIG. 2. The external memory control unit 28 includes a data buffer 31 adapted to buffer data upon writing or reading the data in the memory unit 12, and a memory control signal generating unit 32 adapted to generate the memory control signal 10 and address signal 9 for controlling the memory unit 12 in accordance with a control signal received from the control signal bus 35 and an address received from the internal address bus 33.

Now, operation of the conventional external memory control circuit for the sound field processing DSP will be described.

First, the procedure for recording data in the memory unit 12 will be described.

When the control unit 13 applies a control signal 35 to the external memory control unit 28 after sending an address signal and data to be recorded to the internal address bus 33 and internal data bus 34, respectively, the external memory control unit 28 records the data received from the internal data bus 34 in the data buffer 31. The external memory control unit 28 also reads the address signal on the internal address bus 33 out of the memory control signal generating unit 32. In accordance with the control signal received from the control signal bus 35, the memory control signal generating unit 32 applies appropriate memory control signal 10 and address signal 9 to the memory unit 12. The memory control signal generating unit 32 also controls the data buffer 31 to provide a data signal 11 at the memory unit 12.

Meanwhile, a procedure for reading data out of the memory unit 12 is carried out as the memory control signal generating unit 32 outputs the address signal 9 and memory control signal 10. The data output from the memory unit 12 is recorded in the data buffer 31 in accordance with the address signal 9 and memory control signal 10. The recorded data is sent to the control unit 13 via the internal data bus 34 when the DSP control unit 21 needs the data.

Now, a signal delay carried out in the memory unit 12 will be described. Assuming that fs and Ts represent a sampling frequency and one sampling interval, respectively, they have a relation that $Ts=fs^{-1}$. Accordingly, the number of sampling intervals Ts required for a time delay of Δt can be expressed as follows: $\Delta t/Ts=\Delta t\times fs$. Where writing and reading of data in the memory unit 12 are carried out in a manner that when data is written at an optional address $A_W$, data recorded at another address $A_R$ ($AR_R=A_W+\Delta t/Ts$) is read while shifting all data recorded in the memory unit 12 by an increment of one address every time when one sampling interval elapses, as shown in FIG. 4B, data written at the address $A_W$ at an optional time T is read when it reaches the address $A_R$ after it is shifted by the number of Δt/Ts times, that is, after the time of Δt elapses. As a result, a signal delay effect is obtained.

On the other hand, it may be impossible to shift the entire content recorded in the memory unit 12. In this case, the signal delay may be realized using base and offset addresses. This will be described in conjunction with a case shown in FIG. 5A. When the base address is $A_B$ in the case of FIG. 5A, an actual writing address, where data is written, is "$A_B+A_W$", while an actual reading address, where data is read, is "$A_B+A_R$". As the base address $A_B$ is decremented by one address at every sampling interval Ts in this case, as shown in FIG. 5B, data recorded at the address "$A_B+A_W$" at an optional time T is read at the address "$A_B'+A_R$" after the time of $\Delta t$ elapses. As the time of $\Delta t$ elapses, the base address $A_B$ is decremented by $\Delta t/Ts$, thereby causing it to correspond to a new base address $A_b'$ ($A_B'=A_B-\Delta t/Ts$). Accordingly, the address $A_B+A_W$ corresponds to the address "$A_B'+A_R$" ($A_B'+A_R=(A_B-\Delta/Ts)+(A_W+A\ \Delta/Ts)=A_B+A_W$) after the time of $\Delta t$ elapses. This means that the data recorded at the address "$A_B+A_W$" is read at the address "$A_B'+A_R$" after the time of $\Delta t$ elapses. Thus, a signal delay effect is obtained. In order to achieve such signal delay function, the external memory control unit 28 should be provided with an address operating function.

When the sound field processing circuit executes a certain algorithm or begins to execute another algorithm in addition to the algorithm being currently executed, the content recorded in the memory unit 12 should be initialized so that the new algorithm can be executed. In case of, for example, as shown in FIG. 6A, an Infinite-Impulse-Response (IIR) filter constituted by an adder 61, a time delay circuit 62 having a delay time corresponding to N samples and a multiplier 63 having a gain of g, its impulse response is generated in a manner that gains g are accumulatively multiplied at intervals of N samples, as shown in FIG. 6B. In this case, the time delay circuit 62 is constituted by the memory unit 12. If memory spaces allocated for the time delay circuit 62 in the memory unit 12 are filled with optional values without being initialized, optional initial values which have been recorded in the time delay circuit 62 are output between successive ideal impulse responses, thereby causing the impulse responses to be totally distorted.

The distortion caused by the above-mentioned fact occurs when the sound field processing circuit operates after receiving a power or when a change of algorithm is generated. This distortion is left for a reverberation time of the algorithm being executed and then removed.

In such a sound field processing circuit, accordingly, the generated distortion is prevented from being heard by restricting an output signal using a mute function until the distortion is removed in an initial state that power begins to be supplied or just after a change of algorithm has been made. This may be also achieved by previously executing an algorithm for initializing the entire content of the memory unit 12 to achieve an initialization of the memory unit 12 and then executing a desired algorithm. Where such an output restriction is made, using the muting function, for an algorithm involving a relatively long reverberation time, however, the mute function should be kept for several seconds or above. As a result, there is an output discontinuity that outputting of signals is cut off until a certain time elapses. Where the memory initializing algorithm is executed, there is a problem that the time taken for the initialization increases as the capacity of the memory unit increases. Furthermore, there is a problem that the change of algorithm should be executed two times. As another method for avoiding the distortion, a detection may be made about whether the distortion has sufficiently been removed, every time when data is read out of the memory unit 12. In this case, the data read out of the memory unit 12 is used or ignored, based on the result of the detection. In the case that the read data is ignored, an initial data is used. However, this method has a drawback that the operating speed is decreased.

SUMMARY OF THE INVENTION

Therefore, an object of the invention is to provide an external memory control circuit for a sound field processing DSP capable of obtaining continuous sound listening by shortening the time that sound is cut off upon a change of the sound field algorithm depending on the listening place (i.e., concert hall, meeting hall, church or the like).

In accordance with the present invention, this object is accomplished by providing an external memory control circuit for a digital signal processor adapted to execute an algorithm used in a sound field processing for an input signal and to control a memory unit for obtaining a signal delay required in a computational operation for the sound field processing, comprising: memory buffer control means for receiving a first control signal and a second control signal upon executing the algorithm, thereby performing controls to lead data recorded in the memory unit by the first control signal and to record data externally input thereto in the memory unit by the second control signal; memory buffer means for buffering the data input and output at the memory unit under the controls of the memory buffer control means; switching means for receiving a third control signal in a state that power is supplied to the digital signal processor or when a change of the sound algorithm is made, thereby outputting a selection control signal in accordance with the third control signal; multiplexing means for selecting one of a value output from the memory buffer and a mute signal in accordance with the selection control signal from the switching means and outputting the selected data; and direction selecting means for outputting the data output from the multiplexing means to an internal data bus or outputting a signal on the internal data bus to the memory buffer means under the controls of the memory buffer control means.

BRIEF DESCRIPTION OF THE DRAWINGS

Other objects and aspects of the invention will become apparent from the following description of embodiments with reference to the accompanying drawings in which:

FIG. 8A is a block diagram illustrating a computational operation for a delayed output signal and a unit step function;

FIG. 8B is a diagram illustrating a timing of the unit step function;

FIG. 9A is a view illustrating invalid values being cutoff at t=0;

FIG. 9B is a view illustrating valid values at 0<t<k and invalid valves being cutoff otherwise;

FIG. 9C is a view illustrating valid valves at k≦t;

FIG. 9D is a view illustrating the delayed output signal not being affected by the unit step function;

FIG. 9E is a view illustrating the delayed output signal being affected by the unit step function;

DESCRIPTION OF THE PREFERRED EMBODIMENTS

Figure 1:
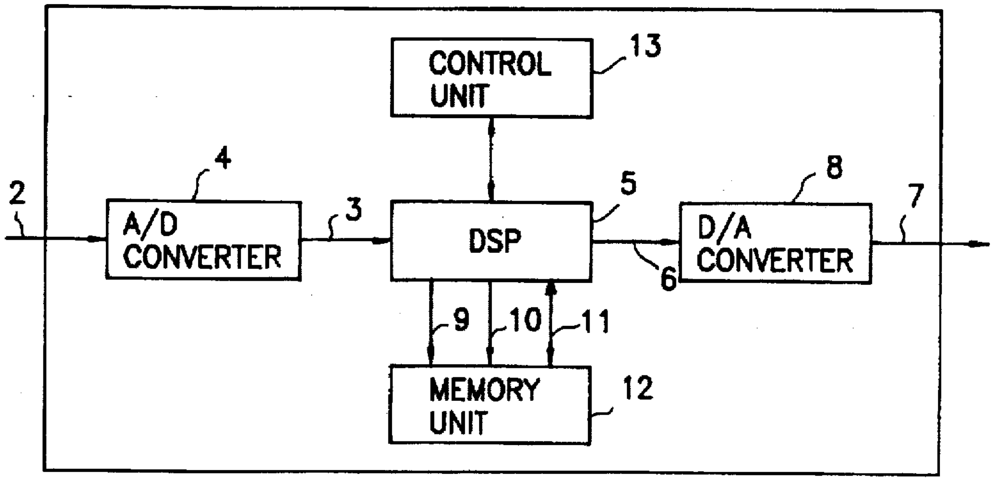
FIG. 1 CONVENTIONAL ART
FIG. 1 is a block diagram illustrating the overall construction of a general sound field processing circuit.
Figure 3:
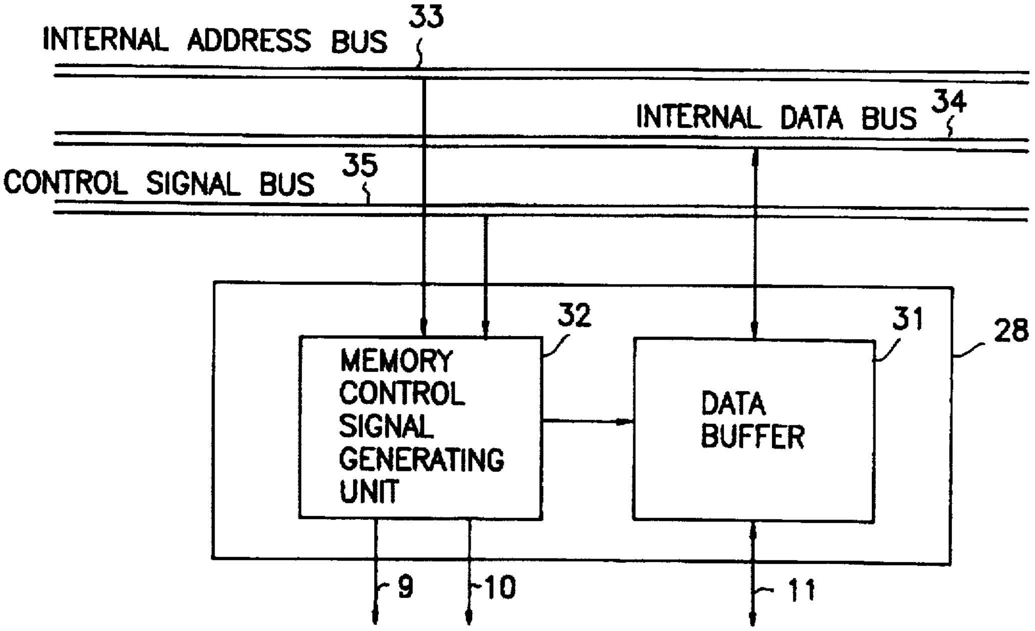
FIG. 3 CONVENTIONAL ART
FIG. 3 is a block diagram illustrating a detailed construction of the external memory control unit shown in FIG. 2.
Figure 2:
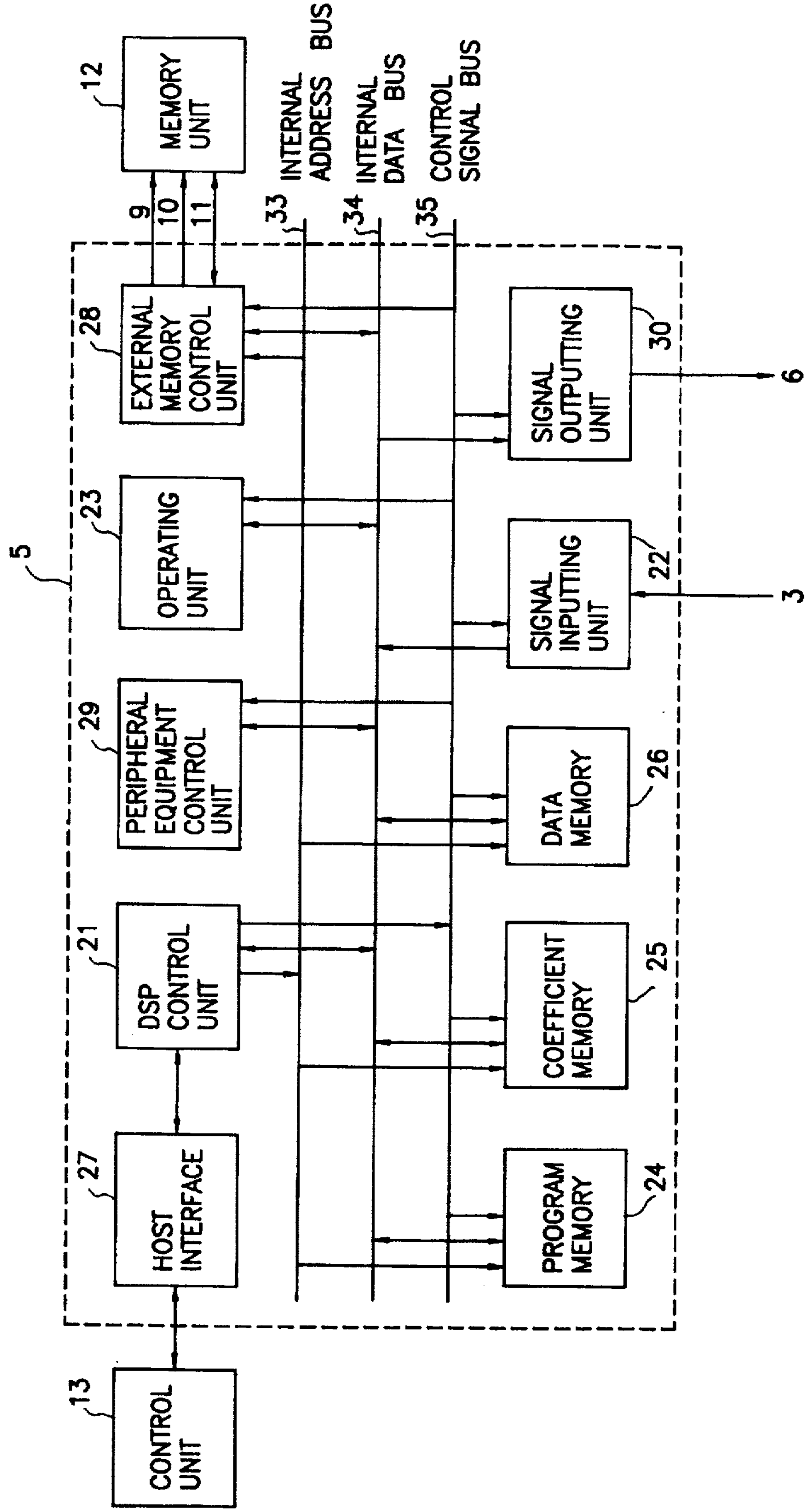
FIG. 2 CONVENTIONAL ART
FIG. 2 is a block diagram illustrating a detailed construction of the DSP shown in FIG. 1.
Figure 4A:
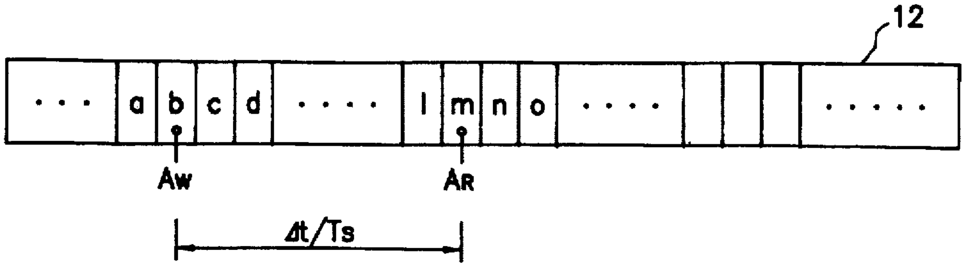
FIG.4A CONVENTIONAL ART
FIG. 4 is diagrams respectively explaining a signal delay made by a shift operation in a memory.
Figure 4B:
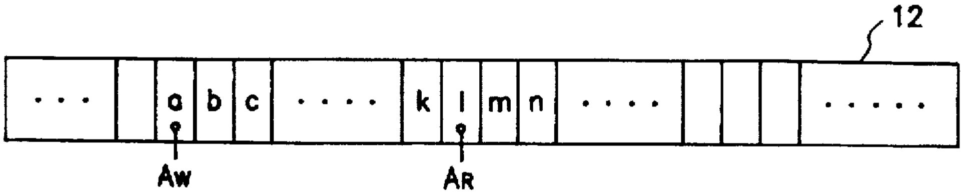
FIG.4B CONVENTIONAL ART
Figure 5A:
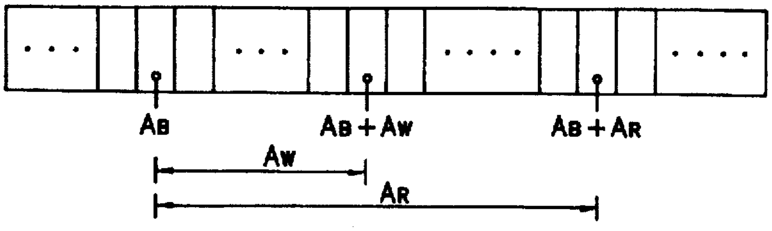
FIG.5A CONVENTIONAL ART
FIGS. 5 is diagrams respectively explaining a signal delay made by a decrement in base address.
Figure 5B:
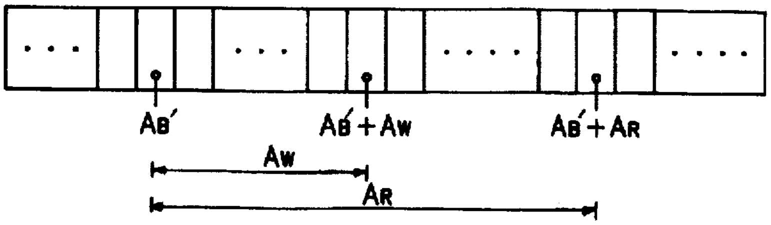
FIG.5B CONVENTIONAL ART
Figure 6A:
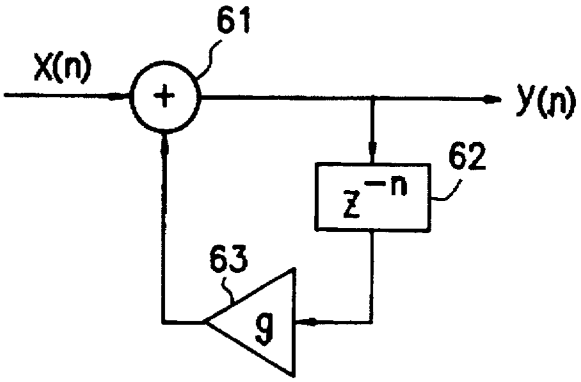
FIG.6A CONVENTIONAL ART
FIG. 6A is a block diagram illustrating an IIR filter.
Figure 6B:
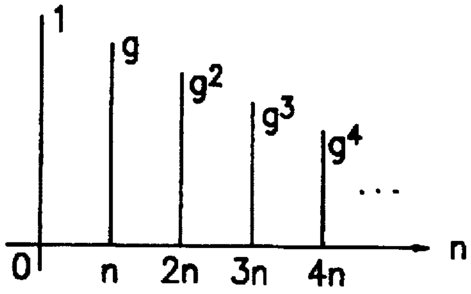
FIG.6B CONVENTIONAL ART
FIG. 6B is a diagram illustrating an impulse response of the IIR filter in an ideal case.
Figure 6C:
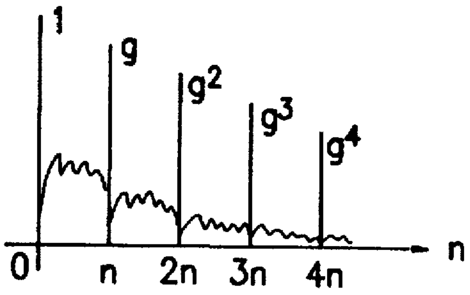
FIG.6C CONVENTIONAL ART
FIG. 6C is a diagram illustrating an impulse response of the IIR filter in a case wherein no initialization has been made.
Figure 7:
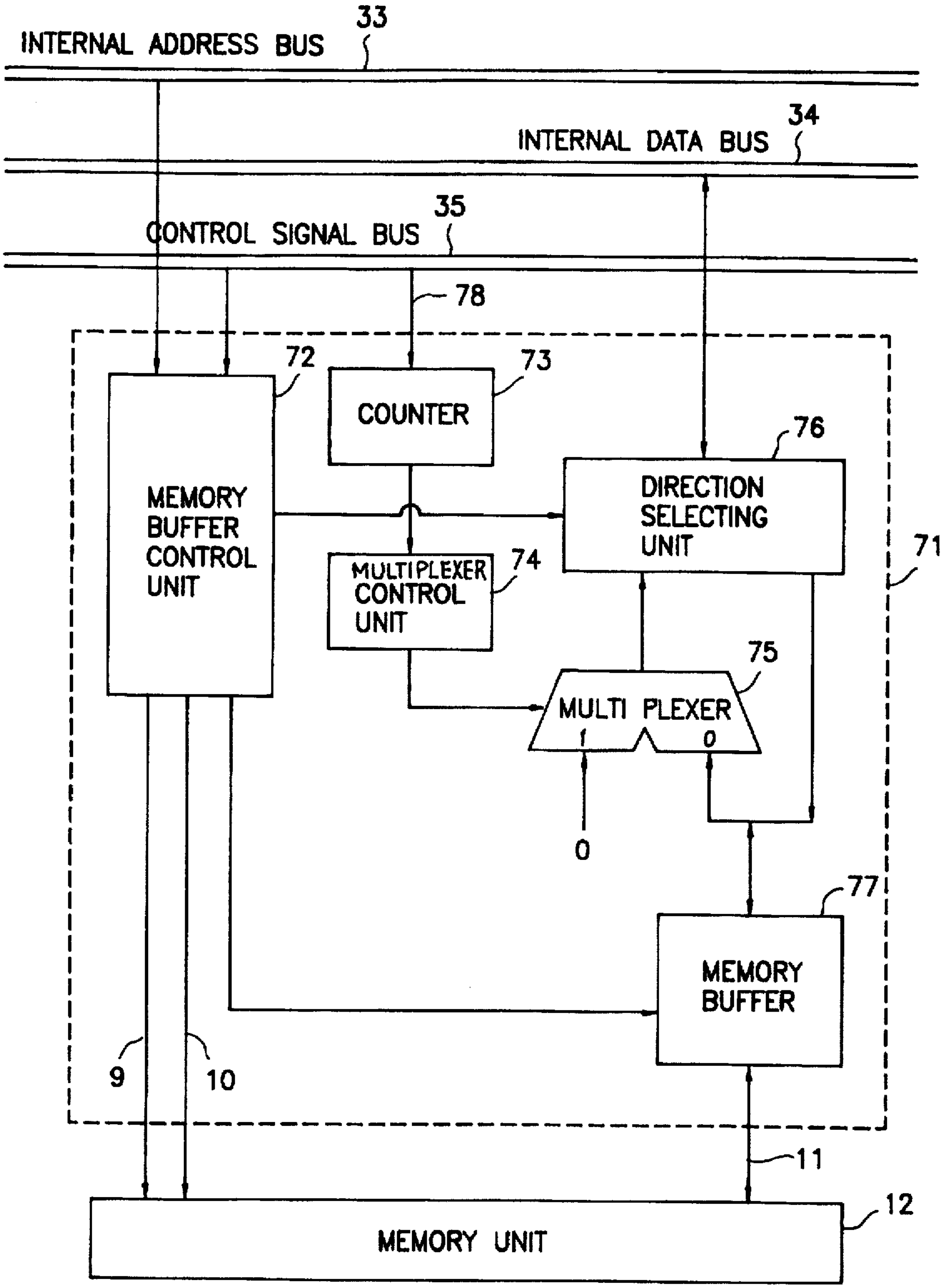
FIG. 7 is a block diagram illustrating an external memory control circuit for a sound field processing DSP in accordance with the present invention.

Referring to FIG. 7, there is illustrated an external memory control circuit 71 for a sound field processing DSP in accordance with the present invention. The sound field processing DSP has a construction similar to that shown in FIGS. 1 and 2. In the following description, similar constituting elements are denoted by the same reference numerals, respectively. As shown in FIG. 7, the external memory control circuit 71 includes a memory buffer control unit 72 for outputting an address signal 9 and a memory control signal 10 upon receiving a lead control signal for the memory unit 12 from the DSP control unit 21 via the control signal bus 35. A counter 73 is also provided which serves to set an initial count value in response to a counter control signal 78 output from the DSP control unit 21 via the control signal bus 35 in an initial state that power begins to be supplied or upon a change of algorithm, to perform a down counting at certain sampling intervals and to stop the counting when the counted value is "zero". The external memory control circuit further includes a multiplexer control unit 74 for selecting "zero" in place of an output from an memory buffer 77 when the counted value of the counter 73 does not correspond to "zero", a multiplexer 75 for selecting the output from the memory buffer 77 or "zero" under a control of the multiplexer control unit 74, and a direction selecting unit 76 for outputting output data from the multiplexer 75 to the side of the internal data bus 34 under a control of the memory buffer control unit 72. The memory buffer 77, which constitutes a part of the external memory control circuit, serves to store data output from the memory unit 12 under a control of the memory buffer control unit 72.

Operation of the external memory control circuit having the above-mentioned arrangement according to the present invention will now be described in conjunction with FIGS. 8 to 10.

When power is supplied or when a change of the algorithm is made, this state is sensed by the host interface 27. In response to this sensing operation, the DSP control unit 21 determines an initial value to be set for the counter 73. Thereafter, the DSP control unit 21 applies a counter control signal 78 to the control signal bus 35 so that the determined initial value is set in the counter 73. When a command for reading data out of the memory unit 12 is executed at a certain point of time as the algorithm is executed after setting the initial value, the DSP control unit 21 applies a control signal to the memory buffer control unit 72 via the control signal bus 35. In accordance with the control signal, the memory buffer control unit 72 sends an address signal 9 and a memory control signal 10 to the memory unit 12. In response to the address signal 9 and memory control signal 10, the memory unit 12 outputs a data signal 11 corresponding to an address given in accordance with the received signals 9 and 10. The value of the data signal 11 is recorded in the memory buffer 77. Where a value other than "zero" has been stored in the counter 73, the multiplexer control unit 74 controls the multiplexer 75 to select "zero", namely, a mute signal in place of the value stored in the memory buffer 77. Also, the memory buffer control unit 72 controls the direction selecting unit 76 to send "zero", in place of the value read out of the memory unit 12, to the internal data bus 34. As a result, this case obtains the same effect as in the case wherein the memory unit 12 is stored with "zero". If the counter 73 has been stored with "zero", the multiplexer control unit 74 controls the multiplexer 75 to select the value stored in the memory buffer 77 in place of "zero". As a result, the internal data bus 34 receives the value read out of the memory unit 12. In this case, the counter 73 serves to decrement its counted value by one at every sampling interval Ts until the counted value corresponds to "zero". When the counted value corresponds to "zero", the decrement thereof is made no longer. During this operation of the counter 73, the multiplexer control unit 74 determines whether the counted value of the counter 73 corresponds to "zero".

When a command for recording data in the memory unit 12 is executed during the execution of the algorithm, data flows through the internal data bus 34, the direction selecting unit 76 and the memory buffer 77 without passing through the counter 73, the multiplexer control unit 74 and the multiplexer 75. Therefore, the data recorded in the memory unit 12 is independent of the value recorded in the counter 73.

The initial value set in the counter 73 corresponds to the number of sampling intervals corresponding to the maximum delay time used in one or more time delay circuits used in the algorithm. Accordingly, such initial value provides an effect of initializing all time delay circuits.

In case of a time delay circuit 81 shown in FIG. 8A, it generates an output signal having an effect of multiplying a unit step function U(t−k) involving a delay by K samples, if k is the initial value set in the counter 73 for an access to the memory unit 12 using the external memory control unit 71 according to the present invention. Since the multiply of the unit step function U(t−k) can be applied to every case wherein data is read out of the memory unit 12, it provides the same effect for all the time delay circuits used in the algorithm.

For the sound field effect algorithm constituted by a plurality of IIR filters and a plurality of FIR filters, every output from the time delay circuits 81 has the form multiplied by U(t−k). However, every input at the time delay circuit 81, namely, every output sent to the memory unit 12 is not affected by the unit step function U(t−k). As shown in FIGS. 9A–9E, accordingly, the time delay circuit 81 is gradually filled with valid values during a period of 0<t<k. During this period, any invalid output from the time delay circuit 81 is cut off. Once t≧k, the value that has filled the time delay circuit 81 for the period of 0<t<k is normally output while being delayed by the time k.

Figure 10:
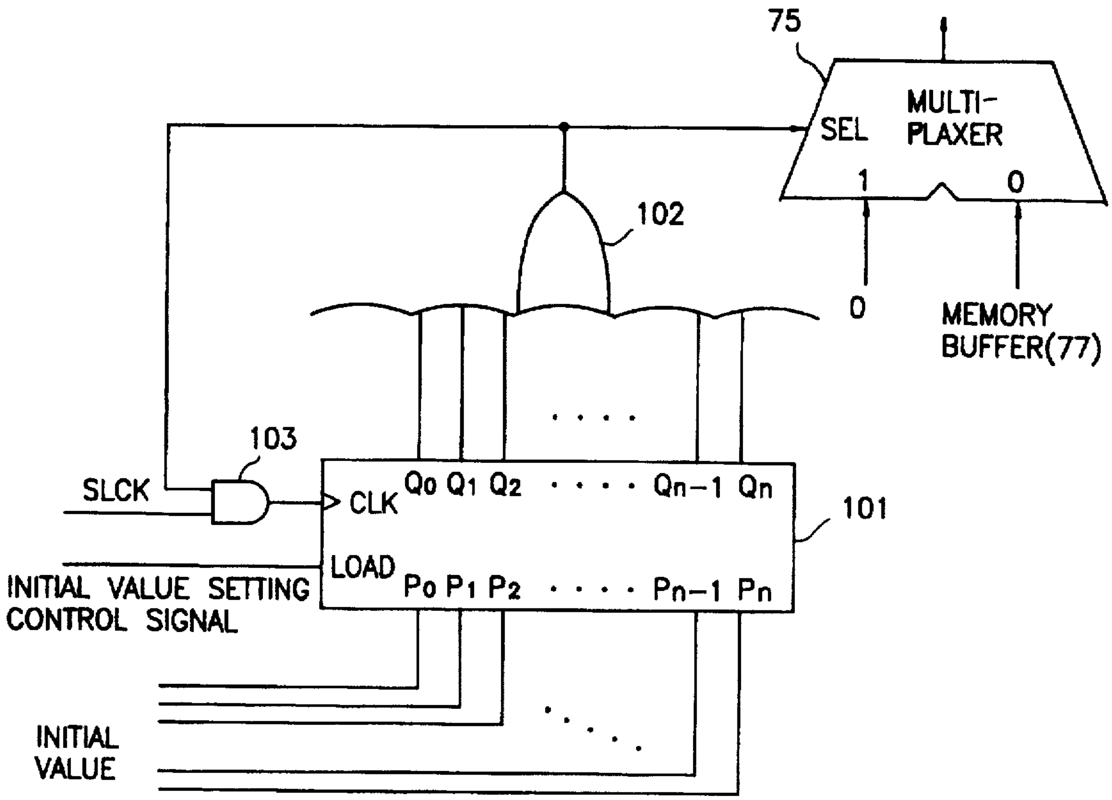
FIG. 10 is a view illustrating a counter and a multiplexer control unit in accordance with an embodiment of the present invention.

As shown in FIG. 10, each of the counter 73 and multiplexer control unit 74 may include a down counter 101 having a parallel loading function for setting an initial value, an OR gate 102 for ORing outputs from the down counter 101, and an AND gate 103 for ANDing an output signal from the OR gate 102 and a sampling clock externally received thereto and adapted to control a clock input at the down counter 101.

Figure 12:
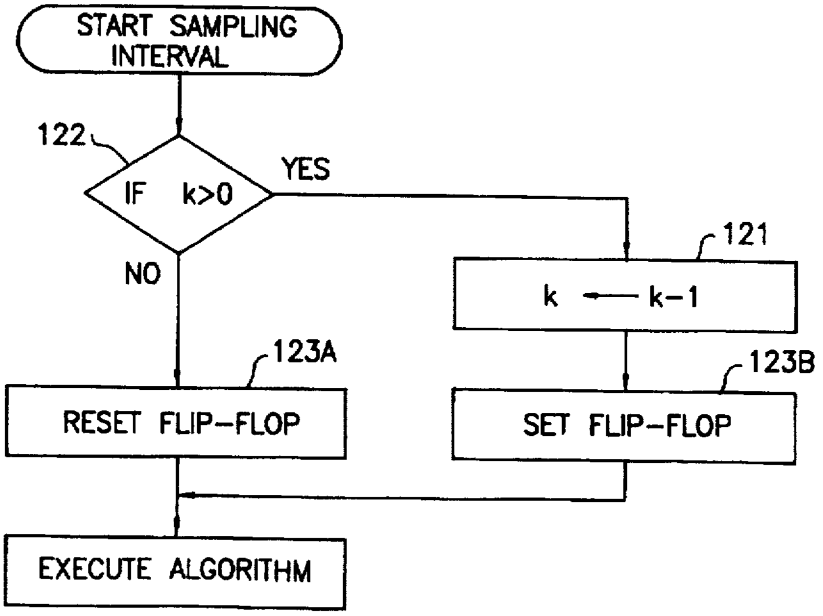
FIG. 12 is a flow chart illustrating signal flows generated in a case wherein the multiplexer control unit is realized by a flip-flop.
Figure 11:
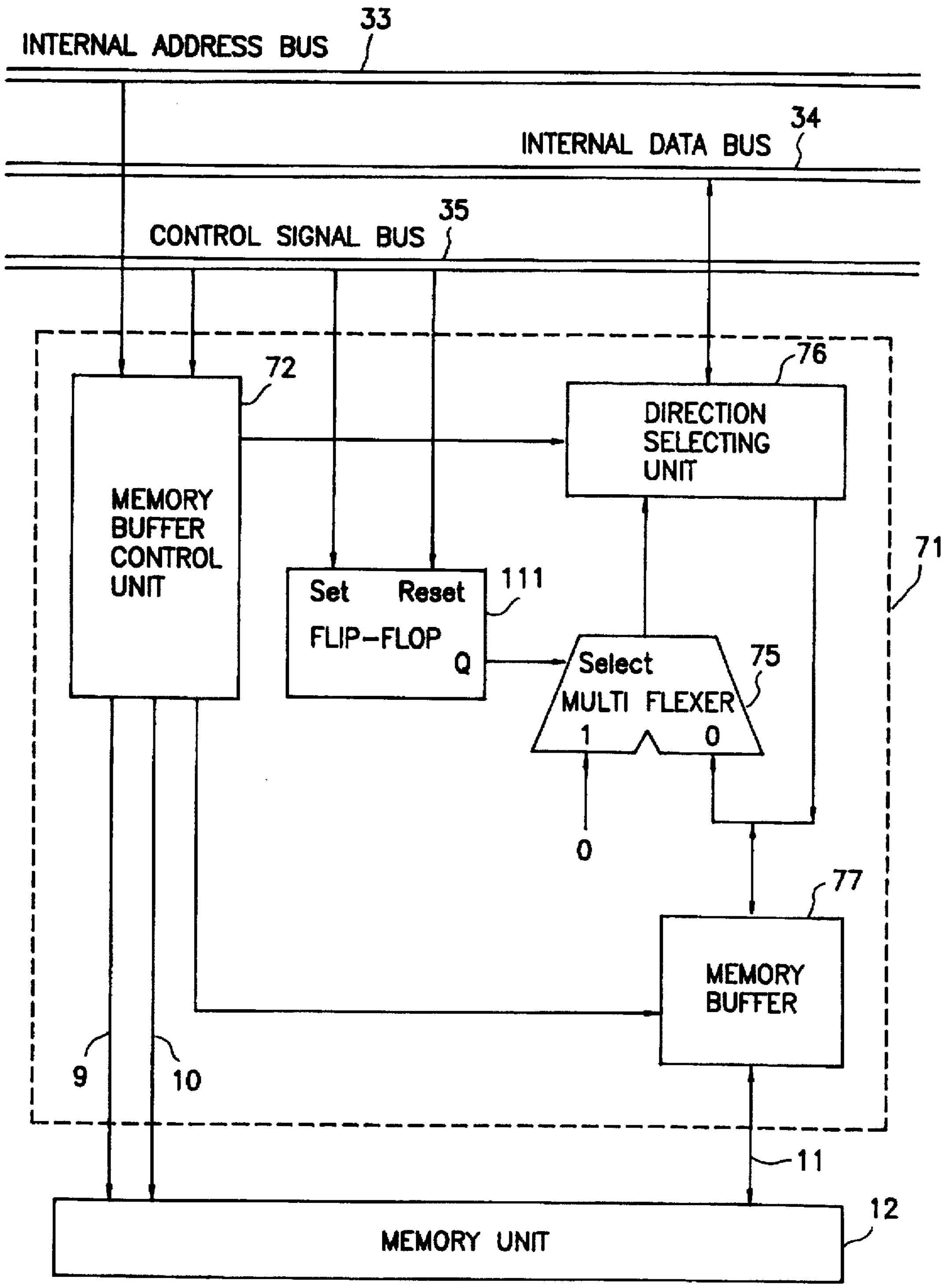
FIG. 11 is a view illustrating a multiplexer control unit in accordance with another embodiment of the present invention.

FIG. 11 illustrates an embodiment of the present invention wherein a flip-flop 11 is used to control the multiplexer 75, in place of the multiplexer counter 73 and multiplexer control unit 74. In this case, the flip-flop 111 is controlled by the DSP control unit 21. Varying the current value of the flip-flop 111 may be executed in the algorithm itself. In this case, the algorithm includes a routine for updating the value of the flip-flop 11 at every sampling interval using a deduction command 121, a condition splitting command 122 and commands 123A and 123B for designating the value of the flip-flop 111, as shown in FIG. 12. In the case shown in FIG. 12, the variable k is checked at every sampling interval. The variable k is used as a reference for determining whether the flip-flop 111 has been set or reset. When k>0, it is decremented by one at every sampling interval. Accordingly, it is possible to obtain an effect of cutting off an input received from the memory unit 12 during a period corresponding the number of times K.

As apparent from the above description, the present invention utilizes a mute function only for the time required to transfer the algorithm itself where a sound field processing circuit is realized using a DSP. Accordingly, it is possible to reduce the time that sound is cut off and thereby obtaining continuous sound listening even when the sound field algorithm is changed while listening.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An external memory control circuit for a digital signal processor adapted to execute an algorithm used in sound field processing for an input signal, the algorithm processing a first control signal and a second control signal, and to control a memory unit for obtaining a signal delay required in a computational operation for the sound field processing, comprising:

memory buffer control means for receiving the first control signal and the second control signal upon executing the algorithm, for controlling reading of data recorded in the memory unit in accordance with the first control signal and controlling recording of data externally input to the memory unit in accordance with the second control signal;

memory buffer means for buffering recorded data output from the memory unit and data to be externally input to the memory unit under the control of the memory buffer control means;

switching means for receiving a third control signal when a power is first supplied to the digital signal processor or when a change of the algorithm is made, and for outputting a selection control signal in accordance with the third control signal;

multiplexing means for selecting one of a data value output from the memory buffer means and a muting data value in accordance with the selection control signal from the switching means and outputting the thusly selected data value; and direction selecting means for outputting the data value output from the multiplexing means to an internal data bus and for outputting data from an internal data bus to the memory buffer means under control of the memory buffer control means.

2. The external memory control circuit in accordance with claim 1, wherein the switching means comprises:

a counter adapted to set an initial count value in response to the third control signal received to the switching means, to perform a counting operation after setting the initial count value and to stop the counting operation when the counted value corresponds to a predetermined value; and a multiplexer control unit for outputting the selection control signal to the multiplexing means based on the counted value.

3. The external memory control circuit in accordance with claim 2, wherein the counter has a parallel loading function for loading the initial count value in a parallel manner when the third control signal is received to the switching means.

4. The external memory control circuit in accordance with claim 2, wherein the multiplexer control unit comprises:

an OR gate for ORing output signals from the counter and thereby outputting a selection control signal; and an AND gate for ANDing the selection control signal from the OR gate and a sampling clock signal and sending the resulting signal to the counter as a clock signal.

5. The external memory control circuit in accordance with claim 2, wherein the counter is a down counter.

6. The external memory control circuit in accordance with claim 2, wherein the third control signal is received to the switching means when the first control signal is received to the memory buffer control means.

7. The external memory control circuit in accordance with claim 2, wherein the switching means does not operate when the second control signal is received to the memory buffer means.

8. The external memory control circuit in accordance with claim 1, wherein the switching means comprises a flip-flop and wherein the algorithm checks a variable for setting or resetting the flip-flop at every sampling interval so that the flip-flop outputs a selection control signal by executing a deduction operation when the variable is not less than a predetermined value, thereby setting the flip-flop while resetting the flip-flop when the variable is less than the predetermined value.

* * * * *